United States Patent
Kurihara et al.

[11] Patent Number: 5,999,448
[45] Date of Patent: Dec. 7, 1999

[54] NONVOLATILE SEMICONDUCTOR MEMORY DEVICE AND METHOD OF REPRODUCING DATA OF NONVOLATILE SEMICONDUCTOR MEMORY DEVICE

[75] Inventors: Hideo Kurihara; Satoshi Takahashi, both of Kanagawa, Japan

[73] Assignee: Fujitsu Limited, Kawasaki, Japan

[21] Appl. No.: 09/223,281

[22] Filed: Dec. 30, 1998

[30] Foreign Application Priority Data

Mar. 17, 1998 [JP] Japan .................................. 10-066887

[51] Int. Cl.$^6$ .................................................. G11C 16/04
[52] U.S. Cl. .............................. 365/185.04; 365/185.28; 365/185.26
[58] Field of Search ........................ 365/185.22, 218, 365/185.26, 185.33, 200, 149, 185.03, 185.02, 185.28, 185.04

[56] References Cited

U.S. PATENT DOCUMENTS

| | | | |
|---|---|---|---|
| 5,210,716 | 5/1993 | Takada | 365/200 |
| 5,323,351 | 6/1994 | Challa | 365/218 |
| 5,867,429 | 2/1999 | Chen et al. | 365/185.33 |

*Primary Examiner*—David Nelms
*Assistant Examiner*—Thong Le
*Attorney, Agent, or Firm*—Armstrong, Westerman, Hattori, McLeland, & Naughton

[57] ABSTRACT

There is provided a nonvolatile semiconductor memory device which has a floating gate electrode and writes data by injecting electrons into the floating gate electrode by applying a voltage to a control gate electrode and erases the data by extracting the electrons from the floating gate electrode. The nonvolatile semiconductor memory device which includes a plurality of word lines, a plurality of bit lines intersecting with the plurality of word lines, and a plurality of memory elements each of which is connected to a word line and a bit line at a location where the word line and the bit line are intersected with each other, comprises at least one monitor bit line which intersects with the word lines, and a plurality of monitor elements which are connected to the monitor bit line and the plurality of word lines at locations where the monitor bit line and the plurality of word lines are intersected with each other.

10 Claims, 8 Drawing Sheets

NONVOLATILE SEMICONDUCTOR MEMORY DEVICE AND METHOD OF REPRODUCING DATA OF NONVOLATILE SEMICONDUCTOR MEMORY DEVICE

BACKGROUND OF THE INVENTION

1. Field of the Invention

The present invention relates to a nonvolatile semiconductor memory device which has a floating gate electrode and can write data by injecting electrons into the floating gate electrode by applying a voltage to a control gate electrode and erase the data by extracting the electrons from the floating gate electrode.

2. Description of the Prior Art

FIG. 1 is a view showing a circuit configuration of a nonvolatile semiconductor memory device in the prior art.

As shown in FIG. 1, in the nonvolatile semiconductor memory device, a plurality of memory elements are arranged in a matrix fashion to form columns and rows. Each of the memory elements consists of an insulated gate field effect transistor which has a floating gate electrode and a control gate electrode. The control gate electrodes of the memory elements in the row direction are connected to a common word line (WL). Drain diffusion regions of the memory elements in the column direction are connected to a common bit line (BL).

In writing data into the memory element, write signals are supplied to a certain word line and a certain bit line to write data into the memory element located at the intersecting point of the word line and the bit line. In contrast, in reading data from the memory element, read signals are supplied to the certain word line and the certain bit line to read the write data from the memory element located at the intersecting point of the word line and the bit line.

FIG. 2A is a plan view showing arrangement of the memory elements and wirings of the nonvolatile semiconductor memory device, which is wired as shown in FIG. 1, on the semiconductor substrate. FIG. 2B is a sectional view showing the nonvolatile semiconductor memory device, taken along a line A—A in FIG. 2A.

As shown in FIG. 2A, a plurality of memory elements are arranged in a matrix fashion. Each of the memory elements is formed of the insulated gate field effect transistor which has the floating gate electrode and the control gate electrode. A common word line (WL) 6b which is connected to the control gate electrodes of the memory elements in the row direction is formed to extend along the row direction. A common bit line (BL) 8 which is connected the drain regions of respective 3 memory elements in the column direction is formed to extend along the column direction.

As shown in FIG. 2B, each of the memory elements has a floating gate electrode (FG) 4 formed on a semiconductor substrate 1 via a tunnel insulating film 3, and a control gate electrode (CG) 6a formed on the floating gate electrode 4 via a gate insulating film 5. The control gate electrodes (CG) 6a of respective transistors are connected to each other by the common word line 6b. The common word lines 6b are formed to extend along the row direction row after row.

As shown in FIG. 2B, field insulating film 2 which acts as isolation regions to isolate respective memory elements is formed on the semiconductor substrate 1.

In the above nonvolatile semiconductor memory device, writing of data into the memory element is carried out as follows. More particularly, an electric field is applied to the semiconductor substrate 1 via the control gate electrode 6a and the floating gate electrode 4 by applying the high voltage to the word line 6b. Accordingly, hot electrons are induced in the semiconductor substrate 1 and are then injected into the floating gate electrode 4 via the tunnel insulating film 3. As a result, a threshold value is increased higher to such extent that a channel cannot be created by the normal reading voltage.

Reading of data from respective memory elements is executed as follows. That is, a voltage which is smaller than that applied when writing of data into the word line 6b is executed is applied. Accordingly, the channels are shut off as they are in the transistors into which the data have been written, but the channels can be formed in the transistors into which the data have not been written yet and then currents flowing through such channels are detected.

By the way, in the nonvolatile semiconductor memory device in the prior art, it has been requested that the data write/read should be carried out at a higher rate. Nevertheless, there has been the problem that the tunnel insulating film through which the hot electrons are passed in writing the data or erasing the data cannot be made thinner since the data being written into the memory elements must be held over the term of guarantee.

In other words, the electrons which have been injected into the floating gate electrode 4 are easier to leak as a thickness of the insulating film around the tunnel insulating film 3 and the floating gate electrode 4 is thinner. Accordingly, in order to hold the charges over the term of guarantee of the memory element, the thickness of the insulating film in the periphery of the floating gate electrode 4 cannot be so made thin. As a result, in the prior art, there has been the problem that high speed writing/reading is disturbed.

SUMMARY OF THE INVENTION

It is an object of the present invention to provide a nonvolatile semiconductor memory device and method of reproducing data of nonvolatile semiconductor memory device which is capable of enhancing write/read rates of data by making an insulating film thinner around a floating gate electrode and also capable of preventing previously generation of error, which is caused when the insulating film is formed thinner around the floating gate electrode, in writing the data.

In the present invention, in addition to a plurality of memory elements each of which is connected to a word line and a bit line at a location where the word line and the bit line are intersected with each other, at least one monitor bit line which intersects with the plurality of word lines is provided, and a plurality of monitor elements which are connected to the monitor bit line and the plurality of word lines at locations where the monitor bit line and the plurality of word lines are intersected with each other are provided.

If an insulated gate field effect transistor which has a floating gate structure, for example, is employed as the memory element and the monitor element respectively, each of capacitance coupling ratios of the memory element and the monitor element is defined as $$\text{capacitance coupling ratio} = C2/(C1+C2)$$

wherein $C1$ is a capacitance created between the semiconductor substrate and the floating gate electrode, and $C2$ is a capacitance between the floating gate electrode and the control gate electrode, and the capacitance coupling ratio of the monitor element is set larger than that of the memory element.

In this case, if a channel width of the monitor element is set narrower than that of the memory element, a relation ship between the above capacitance coupling ratios of the memory element and the monitor element can be satisfied.

Accordingly, since a higher electric field is applied between the semiconductor substrate and the floating gate electrode in the monitor elements rather than the memory elements, the charges stored in the floating gate electrode of the monitor element are ready to leak, or deterioration of the tunnel insulating film put between the semiconductor substrate and the floating gate electrode is accelerated earlier by application of the voltage to read the memory data.

As a result, the row including the memory elements which has a possibility of defect can be detected in advance with the use of the monitor elements. Therefore, if the memory data are written again into the memory elements which belong to the row and in which the memory data have been written, such memory data can be refreshed before the failure is caused in the memory elements.

In order to achieve the above, in the method of reproducing data of the nonvolatile semiconductor memory device according to the present invention, reproduction of the memory data can be carried out by writing memory data into memory elements in a memory element area and simultaneously writing monitor data into monitor elements, afterwards monitoring the monitor data stored in the monitor elements, and writing the memory data into the memory elements again if error is detected when the monitor data are read from the monitor elements.

In this manner, in case the thickness of the tunnel insulating film is made thin, the higher electric field is applied to the tunnel insulating film. However, since the row containing the memory elements which have a possibility of defect can be detected previously by using the monitor elements, reproduction of the memory data can be carried out before the failure is caused in the memory elements.

Therefore, the thin tunnel insulating film can also be employed without anxiety and as a result the higher speed operation of the semiconductor memory device can be achieved.

BRIEF DESCRIPTION OF THE DRAWINGS

FIG. 5 is a plan view showing a configuration of the nonvolatile semiconductor memory device produced by the method of manufacturing the nonvolatile semiconductor memory device according to the embodiment of the present invention, wherein FIG. 4D is a sectional view showing the nonvolatile semiconductor memory device, taken along a line B—B in FIG. 5.

DESCRIPTION OF THE PREFERRED EMBODIMENT

An embodiment of the present invention will be explained in detail with reference to the accompanying drawings hereinafter.

Figure 1:
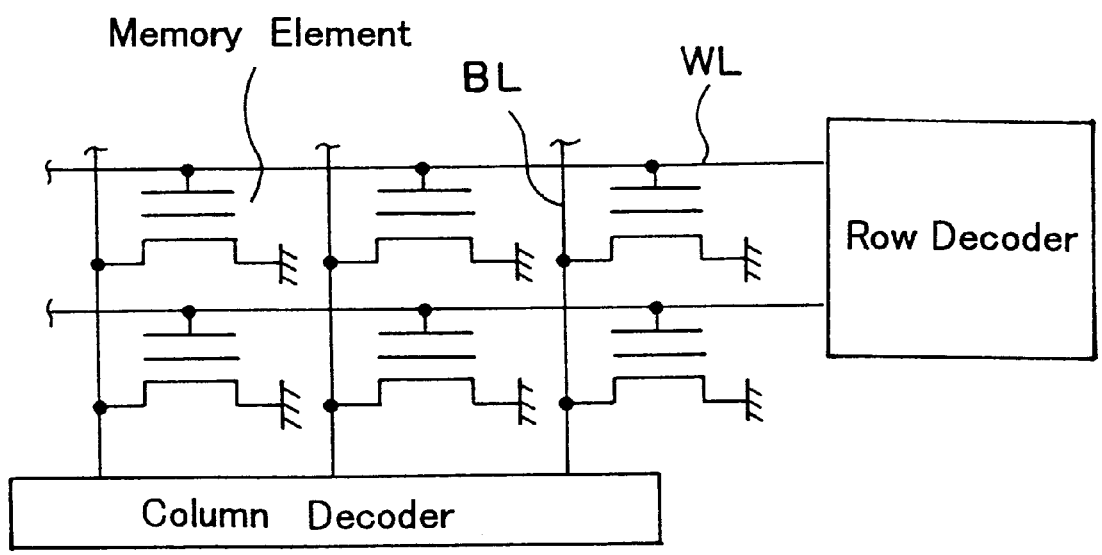
FIG. 1 is a view showing a circuit configuration of a nonvolatile semiconductor memory device in the prior art.
Figure 2A:
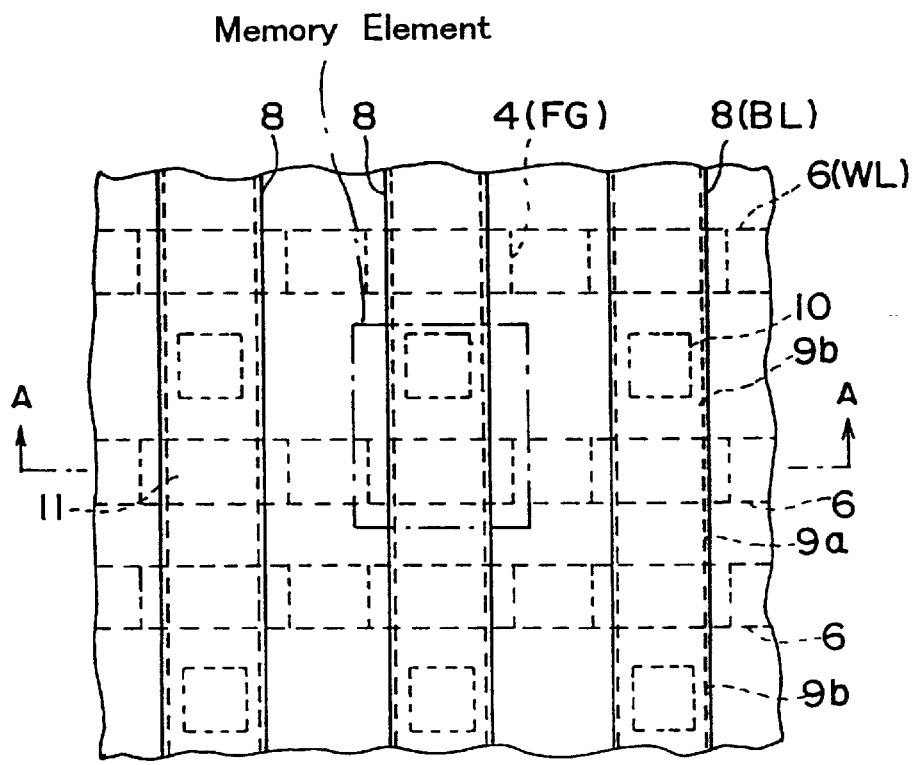
FIG. 2A is a plan view showing a method of manufacturing the nonvolatile semiconductor memory device in the prior art.
Figure 2B:
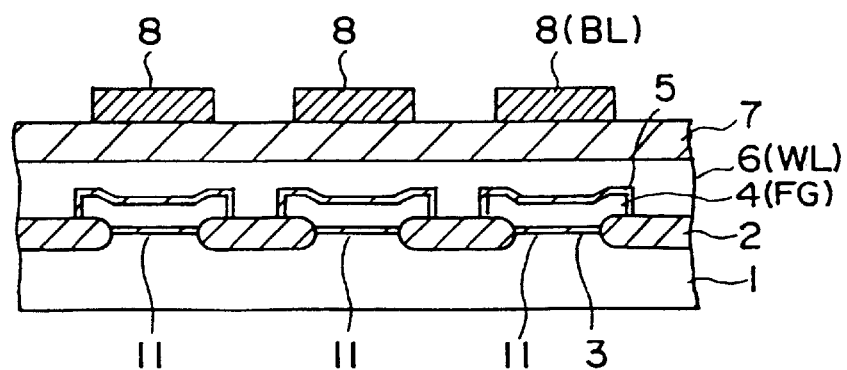
FIG. 2B is a sectional view showing the nonvolatile semiconductor memory device, taken along a line A—A in FIG. 2A.
Figure 3:
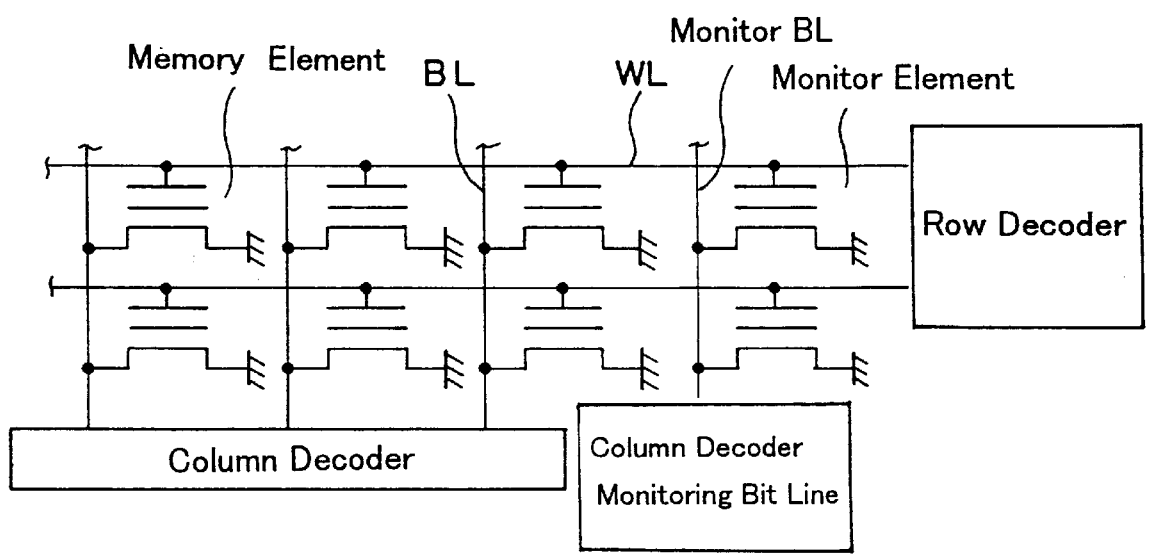
FIG. 3 is a view showing a circuit configuration of a nonvolatile semiconductor memory device according to a embodiment of the present invention.

FIG. 3 is a view showing a circuit configuration of a nonvolatile semiconductor memory device according to a first embodiment of the present invention.

As shown in FIG. 3, the memory elements are arranged in a matrix fashion to form columns and rows. Each of the memory elements consists of an insulated gate field effect transistor which has a floating gate electrode and a control gate electrode. The control gate electrodes of the memory elements in the row direction are connected to a common word line (WL). Drain electrodes of all the memory elements in the column direction are connected to a common bit line (BL).

In writing data into the memory element, write signals are supplied to a certain word line and a certain bit line to write data into the memory element located at the intersecting point of the word line and the bit line. In contrast, in reading data from the memory element, read signals are supplied to the certain word line and the certain bit line to read the write data from the memory element located at the intersecting point of the word line and the bit line.

In addition, at least one monitor element is provided in respective row. A capacitance coupling ratio of the monitor element is set larger than capacitance coupling ratios of respective memory elements which belong to the same row such that a higher electric field is applied to the semiconductor substrate via the tunnel insulating film rather than the memory elements. As a result, degradation due to electric field stress may be caused in the semiconductor substrate quicker than the memory elements. Thus, this configuration has a function as the monitor element to monitor the degradation due to the electric field stress. The capacitance coupling ratio is defined by a following equation.

$$\text{Capacitance coupling ratio} = C2/(C1+C2)$$

wherein C1 is a capacitance of the tunnel insulating film between the silicon substrate and the floating gate electrode, and C2 is a capacitance of the gate insulating film between the floating gate electrode and the control gate electrode.

Next, a device configuration of the above nonvolatile semiconductor memory device will be explained hereinbelow.

Figure 4D:
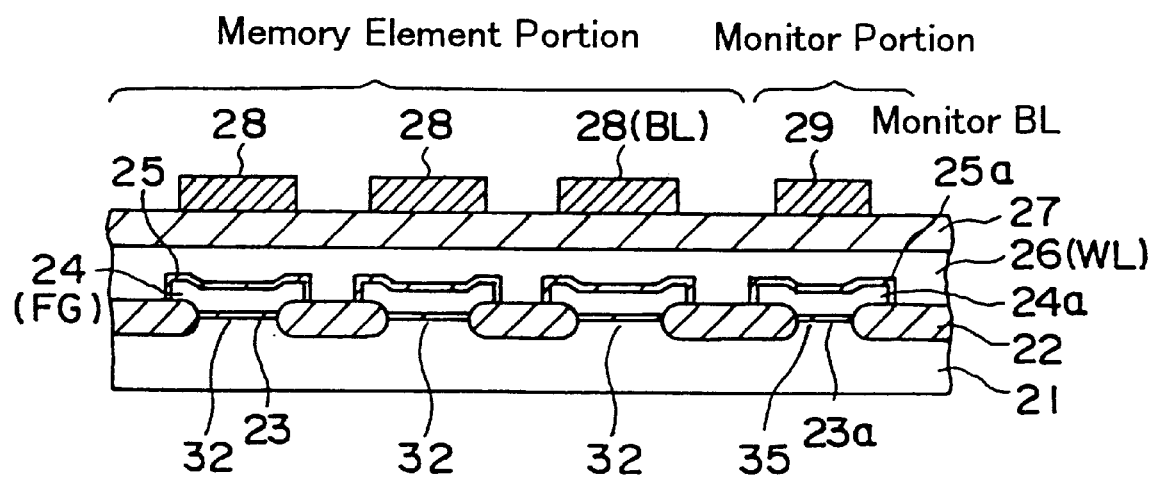
Figure 5:
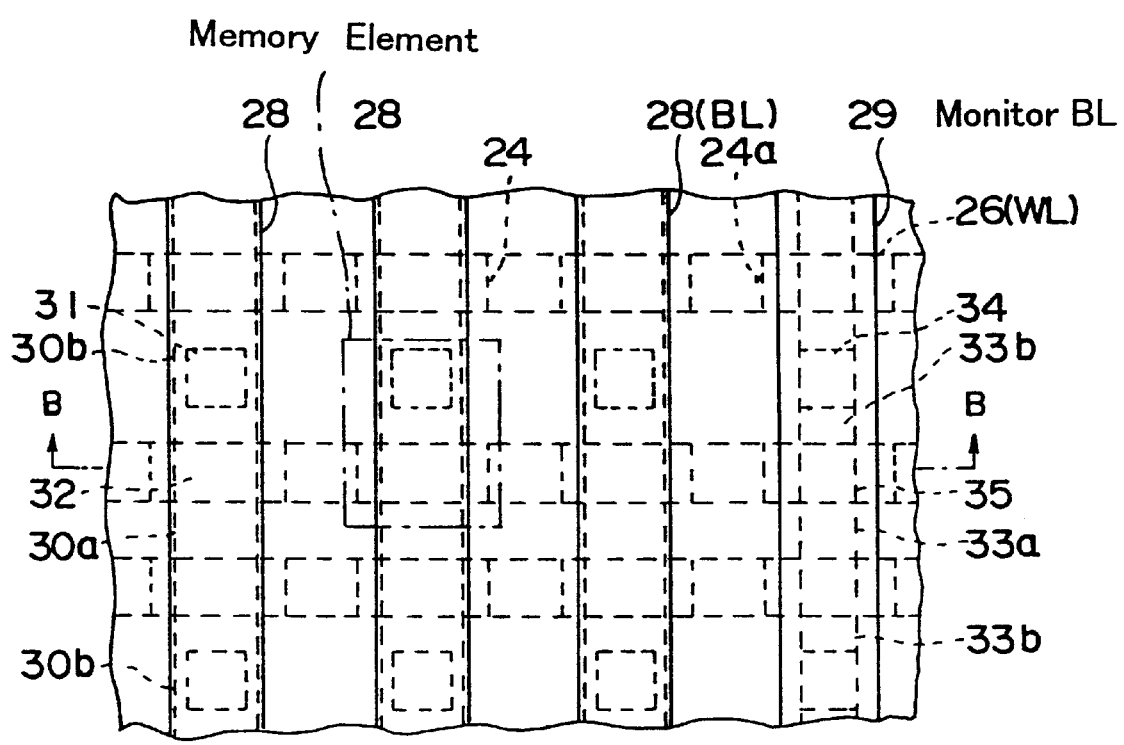

FIG. 5 is a plan view showing a configuration of the memory element and wirings of the nonvolatile semiconductor memory device arranged as shown in FIG. 3. FIG. 4D is a sectional view showing the nonvolatile semiconductor memory device, taken along a line B—B in FIG. 5.

As shown in FIG. 5, the memory elements each consisting of an insulated gate field effect transistor, which has the floating gate electrode 24 and the control gate electrode (first electrode) 26a, are arranged to form the rows and the columns. The common word lines (WLs) 26b, which are connected to the control gate electrodes 26a of all the memory elements aligned in the row direction every row respectively, are formed to extend along the row direction. The common bit lines (BLs) 28, which are connected to the drain diffusion regions 30b of all the memory elements aligned in the column direction every column respectively, are formed to extend along the column direction. The common bit line 28, which is connected to the drain diffusion regions 30b via contact holes 31, has a function of the drain electrode (second electrode) at contact portions to the drain diffusion regions 30b.

Further, the monitor elements each consisting of the insulated gate field effect transistor, which has the floating gate electrode 24a and the control gate electrode (third electrode) 26c being connected to the common word line 26b, are provided every row. The control gate electrode (third electrode) 26c is connected to the common word line 26b every row. The monitor bit line (monitor BL) 29 is connected to drain diffusion regions 33b of respective monitor elements via contact holes 34. The common monitor bit line 29, which is connected to the drain diffusion regions 33b via the contact holes 34, has a function of the drain electrode (fourth electrode) at contact portions to the drain diffusion regions 33b.

As shown in FIG. 4D, the memory elements and the monitor elements have floating gate electrodes (FGs) 24, 24a, which are formed on the silicon substrate (semiconductor substrate) 21 via tunnel insulating films 23, 23a, and the control gate electrodes (CGs) 26a, 26c, which are formed on the floating gate electrodes 24, 24a via gate insulating films 25, 25a, respectively. The control gate electrodes (CGs) 26a, 26c of the memory elements and the monitor elements which belong to respective rows can also act as the common word lines 26b, and are connected mutually by the common word line 26b which extends along the row direction.

Also, as shown in FIG. 4D, a field insulating film 22 which forms device isolation regions 101 to isolate the memory elements respectively is formed on the silicon substrate 21.

In writing of memory data into the memory element, the electric field is applied to the silicon substrate 21 via the control gate electrodes 26a, 26c and the floating gate electrodes 24 by applying a high voltage to the word line 26b to thus induce hot electrons in the silicon substrate 21, and then the hot electrons are injected into the floating gate electrodes 24 via the tunnel insulating film 23. As a result, a threshold value is increased higher to such extent that a channel cannot be created by the normal reading voltage.

In reading of the memory data from respective memory element, the channels can be formed in the transistors into which the data have not been written yet by applying a voltage which is smaller than that applied when writing of the memory data into the word line 26b is executed, while shutting off the channels, as they are, in the transistors into which the data have been written, and then currents flowing through such channels are detected.

Next, a method of manufacturing the above nonvolatile semiconductor memory device will be explained with reference to FIGS. 4A to 4D and FIG. 5 hereinbelow.

FIGS. 4A to 4D are sectional views showing the method of manufacturing the nonvolatile semiconductor memory device of the present invention, and FIG. 5 is a plan view showing the nonvolatile semiconductor memory device.

Figure 4A:
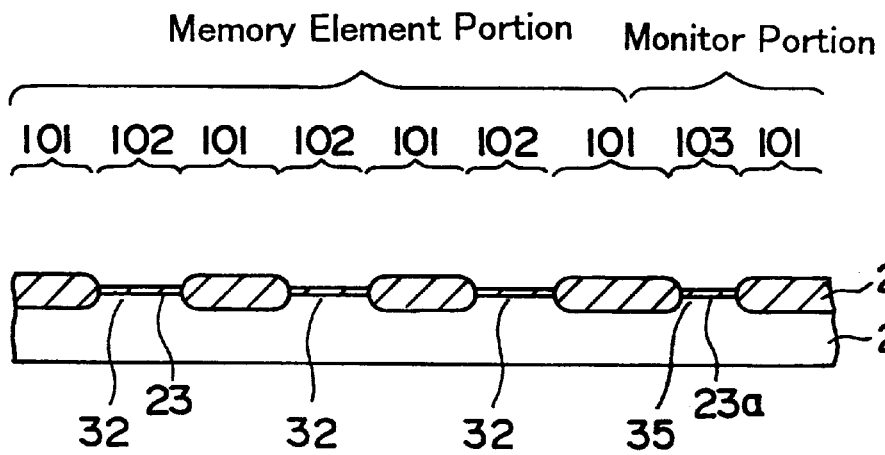
FIGS. 4A to 4D are sectional views showing a method of manufacturing the nonvolatile semiconductor memory device according to the embodiment of the present invention.

At first, as shown in FIG. 4A, a well diffusion layer (not shown) is formed on the silicon substrate 21 to form a CMOS (Complementary MOS), and then the silicon oxide film 22 is formed in the isolation regions 101 by the LOCOS (Local oxidation of Silicon) method. At that time, a width of a monitor element forming region 103 between the isolation regions 101 is set narrower than a width of a memory element forming region 102. The device forming regions 102, 103 are corresponding to a channel width of the device respectively.

Then, ions are implanted into a surface layer of the silicon substrate 21 to adjust the threshold value. Then, the tunnel oxide film 23 is formed by the thermal oxidation method.

Figure 4B:
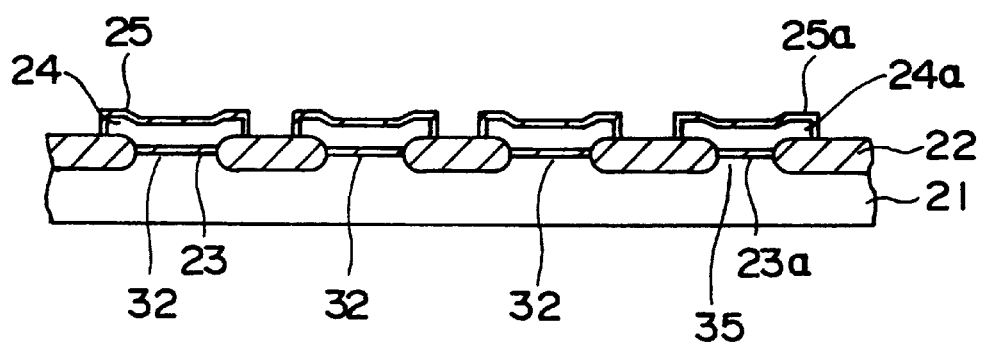

Then, as shown in FIG. 4B, a polysilicon film is formed on the tunnel oxide film 23 and then phosphorus as n-type impurity is doped into the polysilicon film. In turn, the floating gate electrode 24 made of the polysilicon film is formed by patterning the polysilicon film. A width and a length of the floating gate electrode 24 are set substantially equal in both the memory element portion and the monitor portion.

Then, a three-layered ONO film which consists of silicon oxide film, silicon nitride film and silicon oxide film laminated in this order from the lower layer is formed on a surface of the floating gate electrode 24 by the CVD method. Thicknesses of the insulating films are set to 10 nm, 20 nm, 5 nm from the lower layer respectively. The ONO film acts as the gate insulating film 25.

Subsequently, the ONO film which covers peripheral circuit forming regions (not shown) is partially removed. Then, the gate oxide film of 20 nm thickness is formed on the surface of the silicon substrate 21 in the peripheral circuit forming regions.

Figure 4C:
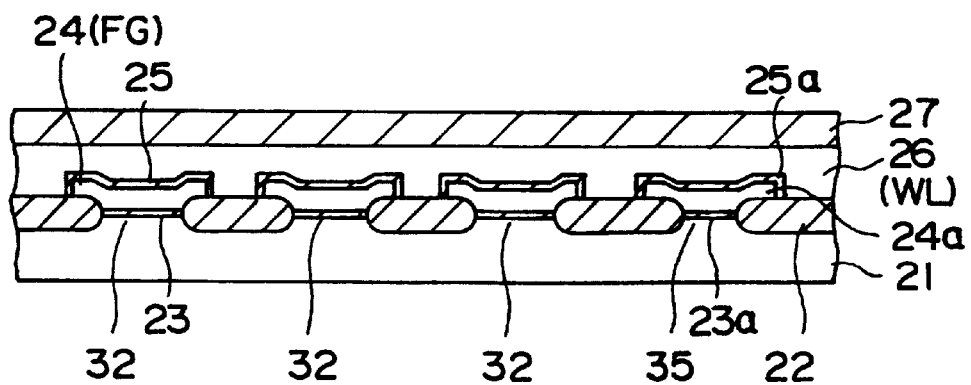

Then, as shown in FIG. 4C, a polysilicon film of 150 nm thickness, a tungsten silicide film of 120 nm thickness, and a polysilicon film of 50 nm thickness are formed in this sequence on the gate insulating film 25 and the gate oxide film of the peripheral circuits by the CVD method. Then, the common word line 26b is formed by patterning the polysilicon film, etc. to extend over all the transistor along the row direction. In this case, the common word line 26b is connected to the control gate electrodes 26a, 26c.

Then, a resist film (not shown) having openings is formed on the silicon substrate 21 which is located adjacent to the word line 26b, and then phosphorus ion is implanted at an acceleration voltage of 40 keV and a dosage of $1 \times 10^{14}$ cm$^{-2}$. Ion implanted diffusion regions are n-type source diffusion regions 33a.

Then, the resist is removed and then a resultant structure is annealed at a temperature of 900° C. for twenty minutes.

In turn, the resist film, which covers the peripheral circuit forming regions and has openings on the silicon substrate 21 located adjacent to the word line 26b, is formed. The openings are formed on the silicon substrate 21 which is opposite to the source diffusion regions 33a with respect to the word line 26b, and the silicon substrate 21 below the openings are the drain diffusion regions 33b. By using the resist film, arsenic ion is implanted into the silicon substrate 21 at an acceleration voltage of 40 keV and a dosage of $3 \times 10^{15}$ cm$^{-2}$. Ion implanted diffusion regions are n-type drain diffusion regions 33b.

Then, in order to form an LDD structure of n-channel transistor (hereinafter referred to as n-ch transistor) in the peripheral circuits, n-type impurity ion is implanted. Then, in order to form an LDD structure of p-channel transistor (hereinafter referred to as p-ch transistor) in the peripheral circuits, p-type impurity ion is implanted. In turn, the silicon oxide film 27 is formed by the CVD method and then patterned to form spacers.

N$^+$ diffusion regions of n-ch transistors are formed by ion-implanting at an acceleration voltage of 40 keV and a dosage of $4 \times 10^{15}$ cm$^{-2}$. Then, p$^+$ diffusion regions of p-ch transistors are formed by ion-implanting BF$_2$ at an acceleration voltage of 40 keV and a dosage of $4 \times 10^{15}$ cm$^{-2}$. Next, annealing process is executed at a temperature of 800° C. for 40 minutes to activate implanted impurities in the drain diffusion regions 33b of the transistor of the peripheral circuits and the memory element portions.

Then, as shown in FIG. 4D, the contact holes 31, 34 are formed in the silicon oxide film 27 to reach the drain diffusion regions 33b, and then a conductive film is formed in the silicon oxide film 27. Then, the bit lines 28 of the memory elements and the bit line 29 of the monitor element are formed by patterning the conductive film. As a result, formation of the memory element portion and the monitor portion has been completed.

Thereafter, the nonvolatile semiconductor memory device has been completed via conventional steps.

Next, a whole outlined configuration of the nonvolatile semiconductor memory device including the aforementioned constitution is explained, and followed by a detail explanation of an operation of the above nonvolatile semiconductor memory device.

Figure 7:
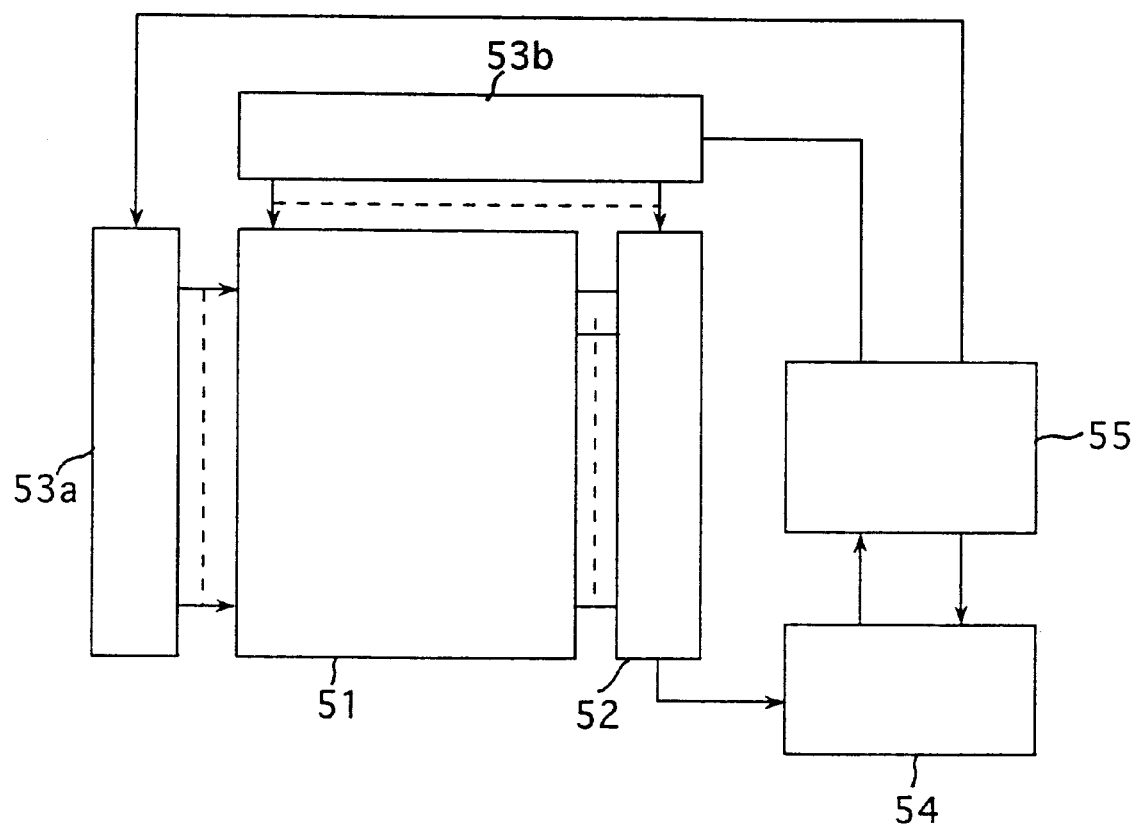
FIG. 7 is a view showing a whole outline configuration of the nonvolatile semiconductor memory device according to the embodiment of the present invention.

The outlined nonvolatile semiconductor memory device comprises as a whole a memory element portion 51, a monitor portion 52, writing means 53a, 53b, monitoring means 54 and control means 55 as shown in FIG. 7.

The writing means 53a, 53b write memory data into said memory elements in the memory element portion 51 and simultaneously write monitor data into monitor elements in the monitor portion 52. The aforementioned row decoder and the column decoder are included in the writing means 53a, 53b.

The monitoring means 54 monitor the monitor data stored in said monitor elements and output a monitor signal on the basis of said monitor data.

The control means 55 receive the monitor signal from the monitoring means 54 and output a rewrite signal which allows said writing means to write the memory data into the memory elements again if error is detected when the monitor data are read from the monitor elements.

Figure 6:
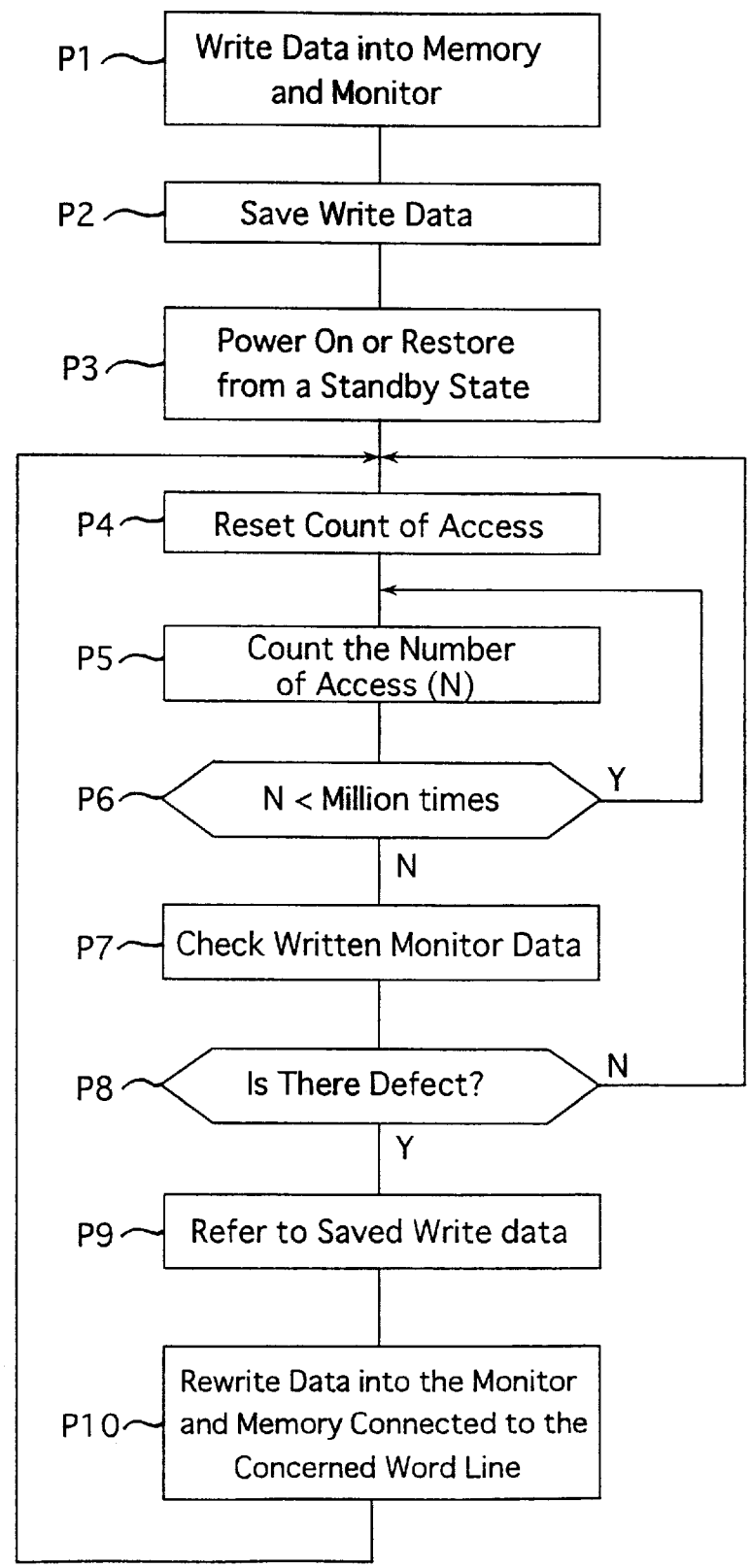
FIG. 6 is a flowchart showing an operation of the nonvolatile semiconductor memory device according to the embodiment of the present invention.

Subsequently, an operation of the above nonvolatile semiconductor memory device will be explained in detail with reference to FIGS. 5 and 6 hereinbelow.

First, avalanche breakdown is caused between the source diffusion region or the drain diffusion region of a certain memory element and the silicon substrate by applying a high voltage to the word line 26b and applying a voltage to the bit line 28 to generate hot electrons. Such hot electrons are injected into the floating gate electrode 24. This operation is carried out along all column direction and all row direction. As a result, the memory data are written into all the memory elements in which the memory data are to be written, and simultaneously the monitor data are written into the monitor element (step P1). In this case, the monitor data are written into all the monitor elements.

Then, memory data concerning the memory elements into which the memory data have been written and the memory elements into which the memory data have not been written are saved (step P2).

Then, in order to use the nonvolatile semiconductor memory device, either a switch of the memory is turned on or the memory is restored from its standby state (step P3).

Then, count of access to the memory elements from which the memory data is reset (step P4). In turn, the first column is selected, and then a voltage to read the memory data is applied along the row direction. Then, the succeeding column is selected and then the memory elements are accessed sequentially in the row direction. This operation is repeated until accesses for reading the memory data from the memory elements located in all columns and all rows are completed.

At that time, the number of access (N) is counted (step P5). The number of the count of access is incremented. Then, it is decided whether or not the number of access (N) exceeds million times (step P6). If it is decided that the number of access (N) is within million times, the process returns to the first column again to start the access.

This operation is repeated until the number of access (N) exceeds million times. When the number of access (N) exceeds million times, the monitor data being written in all the monitor elements are checked (step P7). Then, it is decided whether or not there is defect in the monitor data (step P8). For example, if the monitor data is not defect, the channel is still closed even when the reading signal is applied. In contrast, if the monitor data is defect, the channel is opened to flow the current therethrough when the reading signal is applied.

If there is no defect, the count of access is reset and then the reading operation is started from step P4 once again. In contrast, if there is defect, it is specified on which row such defect is caused.

Then, the memory data being saved in step P2, which corresponds to the specified row, are referred to respectively (step P9). Then, the same memory data as defect memory data is written into the concerned memory element again (step P10).

Then, the count of access is reset, and then the counting operation is started from step P4.

As described above, the row which has a possibility of defect can be detected beforehand by using the monitor elements, so that the write data can be refreshed by writing the write data again to the memory elements which belong to the row and into which the write data have been written.

In this manner, in the embodiment of the present invention, in addition to a plurality of memory elements, each of which is connected to the word line 26b and the bit line 28 respectively near the intersecting point between the word line (WL) 26b and the bit line (BL) 28, at least one monitor bit line (monitor BL) 29 which intersects with the word lines 26b is provided, and also a plurality of monitor elements, each of which is connected to a plurality of word lines 26b and the monitor bit line 29 respectively near the intersecting point between the plurality of word lines 26b and the monitor bit line 29, are provided. By way of example, if a channel width of the monitor element is set narrower than that of the memory element, the capacitance coupling ratio of the monitor element can be set larger than that of the memory element.

Accordingly, since a higher electric field is applied between the silicon substrate 21 and the floating gate electrode 24a in the monitor element rather than the memory elements, leakage of the charges stored in the floating gate electrode 24a easily occurs, otherwise deterioration of the tunnel insulating film 23a which is put between the silicon substrate 21 and the floating gate electrode 24a is accelerated earlier.

Therefore, the row in which there is a possibility of defect can be detected in advance with the use of the monitor element. For example, after the memory data have been written into the memory elements in the memory element portion and also the monitor data have been written into the monitor elements, the monitor data can always be monitored.

In other words, in case the thickness of the tunnel insulating films 23, 23a is formed thinner, the higher electric field is applied to the tunnel insulating films 23, 23a. However, since the row which has a possibility of defect can be detected previously by using the monitor elements, reproduction of the memory data can be carried out before the failure is caused in the memory elements.

For this reason, the thin tunnel insulating film 23 can also be employed without anxiety and therefore the higher speed operation of the semiconductor memory device can be achieved.

As mentioned above, in the present invention, at least one monitor bit line 29 which intersects with the word lines 26*b* is provided, and also a plurality of monitor elements, each of which is connected to a plurality of word lines 26*b* and the monitor bit line 29 respectively near the intersecting point between the plurality of word lines 26*b* and the monitor bit line 29, are provided, in addition to a plurality of memory elements, each of which is connected to the word line 26*b* and the bit line 28 respectively near the intersecting point between the word line (WL) 26*b* and the bit line (BL) 28.

For instance, if a channel width of the monitor element is set narrower than that of the memory element, the capacitance coupling ratio of the monitor element can be set larger than that of the memory element such that the higher electric field can be applied to the tunnel insulating film of the monitor elements rather than that of the memory elements.

As a result, since deterioration of the tunnel insulating film of the monitor elements is accelerated, the row in which the memory elements having a possibility of defect are aligned can be detected previously by monitoring the monitor data, so that reproduction of the memory data can be carried out before the failure is caused in the memory elements.

Accordingly, the thin tunnel insulating film 23 can also be employed without anxiety and therefore the higher speed operation of the semiconductor memory device can be achieved.

What is claimed is:

1. A nonvolatile semiconductor memory device comprising:

a plurality of word lines, a plurality of bit lines, a plurality of memory elements, each of which is connected to both one of said plurality of word lines and one of said plurality of bit lines, so that each one of said memory elements corresponds to selected one of word lines and to selected one of bit lines, further comprising:

at least one monitor bit line; and a plurality of monitor elements, each of which is connected to said monitor bit line and one of said plurality of word lines, so that each of said monitor elements corresponds to selected one of said word lines and to said monitor bit line, wherein each of the memory elements and the monitor elements is formed of an insulated gate field effect transistor which has a floating gate electrode formed on a semiconductor substrate via a tunnel insulating film, wherein the tunnel insulating film of at least one of said monitor element is thinner than the tunnel insulating film of at least one of said memory elements.

2. A nonvolatile semiconductor memory device according to claim 1, wherein each of said plurality of memory elements is at a location where said word line and said bit line intersect with each other, and each of said plurality of monitor elements is at a location where said monitor bit line and said plurality of word lines intersect with each other.

3. A nonvolatile semiconductor memory device according to claim 1, wherein each of the memory elements and the monitor elements has a control gate electrode formed on a surface of the floating gate electrode via a gate insulating film, source/drain diffusion regions formed on the semiconductor substrate on both sides of the floating gate electrode, and source/drain electrodes which are formed to contact the source/drain diffusion regions respectively, control gate electrodes of the memory elements and the monitor elements are connected to the word lines, one electrodes of the source/drain electrodes of the memory elements are connected to the bit lines, and one electrodes of the source/drain electrodes of the monitor elements are connected to the monitor bit line.

4. A nonvolatile semiconductor memory device according to claim 3, wherein each of capacitance coupling ratios of the memory element and the monitor element is defined as capacitance coupling ratio=C2/(C1+C2)

wherein C1 is a capacitance between the semiconductor substrate and the floating gate electrode, and C2 is a capacitance between the floating gate electrode and the control gate electrode, and the capacitance coupling ratio of the monitor element is set larger than that of the memory element.

5. A nonvolatile semiconductor memory device according to claim 4, wherein a width of a channel of the monitor element, which is formed in the semiconductor substrate below a tunnel insulating film of the monitor element is set narrower than that of a channel which is formed in the semiconductor substrate below the tunnel insulating film of the memory element.

6. A nonvolatile semiconductor memory device having memory elements and monitor elements, comprising:

writing means writing memory data into said memory elements and simultaneously writing monitor data into monitor elements;

monitoring means monitoring the monitor data stored in said monitor elements and outputting a monitor signal on the basis of said monitor data; and control means receiving said monitor signal from said monitoring means, and outputting a rewrite signal which allows said writing means to write the memory data into said memory elements again if error is detected when the monitor data are read from said monitor elements.

7. A method of reproducing data of the nonvolatile semiconductor memory device comprising the steps of:

writing memory data into memory elements and simultaneously writing monitor data into monitor elements;

monitoring the monitor data stored in the monitor elements; and writing the memory data into the memory elements again if error is detected when the monitor data are read from the monitor elements.

8. A method of reproducing data of the nonvolatile semiconductor memory device according to claim 7, wherein a plurality of memory elements are connected to each of monitor elements and the memory data is written again into the all memory elements connected to said monitor element in which error is detected.

9. A nonvolatile semiconductor memory device comprising:

a plurality of word lines, a plurality of bit lines, a plurality of memory elements, each of which is connected to both one of said plurality of word lines and one of said plurality of bit lines, so that each one of said memory elements corresponds to selected one of word lines and to selected one of bit lines, further comprising:

at least one monitor bit line; and a plurality of monitor elements, each of which is connected to said monitor bit line and one of said plurality of word lines, so that each of said monitor elements corresponds to selected one of said word lines and to said monitor bit line;

wherein each of the memory elements and the monitor elements is formed of an insulated gate field effect transistor which has a floating gate electrode formed on a semiconductor substrate via a tunnel insulating film, a control gate electrode formed on a surface of the floating gate electrode via a gate insulating film, source/drain diffusion regions formed on the semiconductor substrate on both sides of the floating gate electrode, and source/drain electrodes which are formed to contract the source/drain diffusion regions respectively, control gate electrodes of the memory elements and the monitor elements are connected to the word lines, one electrodes of the source/drain electrodes of the memory elements are connected to the bit lines, and one electrodes of the source/drain electrodes of the monitor elements are connected to the monitor bit line;

wherein each of capacitance coupling ratios of the memory element and the monitor element is defined as capacitance coupling ratio=$C2/(C1+C2)$ wherein C1 is a capacitance between the semiconductor substrate and the floating gate electrode, and C2 is a capacitance between the floating gate electrode and the control gate electrode, and the capacitance coupling ratio of the monitor element is set larger than that of the memory element.

10. A nonvolatile semiconductor memory device having memory elements and monitor elements, comprising:

writing circuit writing memory date into said memory elements and simultaneously writing monitor date into monitor elements;

monitoring circuit monitoring the monitor data stored in said monitor elements and outputting a monitor signal and the basis of said monitor data; and control circuit receiving said monitor signal from said monitoring means, and outputting a rewrite signal which allows said writing means to write the memory data into said memory elements again if error is detected when the monitor data are read from said monitor elements, wherein each of the memory elements and the monitor elements is formed of an insulated gate field effect transistor which has a floating gate electrode formed on a semiconductor substrate via a tunnel insulating film, a control gate electrode formed on a surface of the floating gate electrode via a gate insulating film, source/drain diffusion regions formed on the semiconductor substrate on both sides of the floating gate electrode, and source/drain electrodes which are formed to contract the source/drain diffusion regions respectively, control gate electrodes of the memory elements and the monitor elements are connected to the word lines, one electrodes of the source/drain electrodes of the memory elements are connected to the bit lines, and one electrodes of the source/drain electrodes of the monitor elements are connected to the monitor bit line;

wherein each of capacitance coupling ratios of the memory element and the monitor element is defined as capacitance coupling ratio=$C2/(C1+C2)$ wherein C1 is a capacitance between the semiconductor substrate and the floating gate electrode, and C2 is a capacitance between the floating gate electrode and the control gate electrode, and the capacitance coupling ratio of the monitor element is set larger than that of memory element.

* * * * *